United States Patent [19]

Lee et al.

[11] Patent Number: 5,700,518
[45] Date of Patent: Dec. 23, 1997

[54] FABRICATION METHOD FOR DIAMOND-COATED CEMENTED CARBIDE CUTTING TOOL

[75] Inventors: Wook-Seong Lee, Kyungki-Do; Young-Joon Baik; Kwang Yong Eun, both of Seoul, all of Rep. of Korea

[73] Assignee: Korea Institute of Science and Technology, Seoul, Rep. of Korea

[21] Appl. No.: 712,707

[22] Filed: Sep. 12, 1996

[30] Foreign Application Priority Data

Apr. 26, 1996 [KR] Rep. of Korea ............... 13138/1996

[51] Int. Cl.[6] ............... C23C 16/26; B05D 3/10
[52] U.S. Cl. ............... 427/249; 427/309; 205/674; 407/119; 156/656.1
[58] Field of Search ............... 427/307, 309, 427/249; 205/674; 156/656.1; 407/119

[56] References Cited

U.S. PATENT DOCUMENTS

| | | |
|---|---|---|
| 4,601,783 | 7/1986 | Krulik ............... 156/655 |
| 5,236,740 | 8/1993 | Peters et al. |
| 5,380,408 | 1/1995 | Svensson ............... 204/129.1 |

FOREIGN PATENT DOCUMENTS

19522372A1  1/1996  Germany.

OTHER PUBLICATIONS

Shibuki et al, "Adhesion Strength of Diamond Films on Cemented Carbide Substrates", Surface and Coatings Technology, 36(1988) pp. 295–302.

*Primary Examiner*—Roy V. King
*Attorney, Agent, or Firm*—Lowe, Price, LeBlanc & Becker

[57] ABSTRACT

A fabrication method for a diamond-coated cemented carbide cutting tool includes electrolytically etching the surface of a cemented carbide cutting tool with a NaOH or KOH aqueous solution or chemically etching the surface of the cemented carbide cutting tool with a $KMnO_4$+KOH aqueous solution, and depositing a diamond film on the cemented carbide cutting tool. A stronger etching effect than by using a Murakami solution can be achieved, and no poisonous material is included in the etchant. In addition, disposal of the waste etchant is made simpler, and the adhesion between the diamond film coating and the cemented carbide cutting tool can be strengthened.

5 Claims, No Drawings

FABRICATION METHOD FOR DIAMOND-COATED CEMENTED CARBIDE CUTTING TOOL

BACKGROUND OF THE INVENTION

1. Field of the Invention

The present invention relates to coating a diamond film on a cemented carbide cutting tool, and in particular, to an improved fabrication method for a diamond-coated cemented carbide cutting tool which is capable of enhancing the adhesion of a diamond film to a cemented carbide by electrolytically etching the surface of the cemented carbide with a NaOH or KOH aqueous solution before the deposition of the diamond film, or by chemically etching the same with a $KMnO_4$+KOH aqueous solution.

2. Description of the Conventional Art

Conventionally, a cemented carbide cutting tool having a surface which is coated with a diamond film is known to have a much superior cutting capability compared to a general cemented carbide cutting tool.

However, a significant problem with such a cemented carbide cutting tool is that the diamond-coated film peels off from the cemented carbide cutting tool and as a result loses its function.

The above problem occurs when the adhesion between the surface of the cemented carbide cutting tool and the diamond-coated film is not strong enough. Many methods to enhance the adhesion therebetween have been suggested, but the simplest method so far suggested is to etch the surface of the cemented carbide cutting tool with a chemical solution.

Two etching methods are chiefly used: one is to etch away a binder phase of the surface of the cemented carbide cutting tool with an acid, and the other is to etch away the carbide phase.

The former method involves removing cobalt down to a predetermined depth since the cobalt used as the binder phase forms a non-diamond phase between the diamond film and the cemented carbide cutting tool due to its catalytic action. But this method itself does not provide a satisfactory adhesion.

On the other hand, the latter method involves etching the carbide phase by using a Murakami's reagent and then etch the cobalt phase as in the former method. U.S. Pat. No. 5,236,740, discloses a fabrication method for a diamond-coated cemented carbide cutting tool using a Murakami's reagent composed of 10 g of potassium ferricyanide +10 g of potassium hydroxide +100 g of water, in which the surface of the cemented carbide cutting tool is etched for more than two minutes, and then etched for more than five seconds with a mixed solution of sulfuric acid-hydrogen peroxide.

According to this patent disclosure, the Murakami's reagent dissolves a predetermined amount of the carbide phase off the surface of the cemented carbide cutting tool, resulting in a considerable improvement in the adhesion of the diamond film, but there is no specific mention about the reason why such treatment increases the adhesion. In addition, the cost of potassium ferricyanide is about ten times higher than that of potassium hydroxide, wherein the two reagents comprise the Murakami reagent. Above all, when the potassium ferricyanide is heated or contacts with an acid or its vapor, extremely poisonous cyanide fumes are generated.

SUMMARY OF THE INVENTION

Accordingly, it is an object of the present invention to provide an improved fabrication method for a diamond-coated cemented carbide cutting tool which is capable of enhancing the stability of the same and using a non-poisonous aqueous solution for etching the surface of the diamond-coated cemented carbide cutting tool.

It is another object of the present invention to provide an improved fabrication method for a diamond-coated cemented carbide cutting tool which is capable of strengthening the adhesion of the diamond-coated film by enhancing the effect of a mechanical interlocking between the diamond film and the surface of the cemented carbide cutting tool by etching the carbide phase of the cemented carbide cutting tool and increasing the roughness of the surface of the same.

When the potassium ferricyanide in the Murakami reagent which is used in the conventional art is reacted with KOH in the same reagent, it yields water and oxygen.

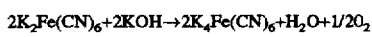

Thus, the pottassium ferrycianide acts as an oxidizer, and when an electrical potential is applied to a test piece to be etched instead of the oxidizer, the same effect can be achieved.(see: Metallography, Principles and practice, by George F. Vader Voort, MacGraw-Hill Book Co. 1984)

In a first method according to the present invention, the adhesion between the surface of the cemented carbide cutting tool and the diamond film can be enhanced by coating the diamond film on the surface of the cemented carbide after etching the same by applying a voltage to the objects to be etched instead of removing the poisonous potassium ferricyanide which is an oxidizer.

And in a second method according to the present invention, a $KMnO_4$+KOH aqueous solution is used as an etching solution for etching the surface of the cemented carbide cutting tool, with $KMnO_4$ substituted for the poisonous potassium ferricyanide, before coating the diamond film thereon to strengthen the adhesion between the surface of the cemented carbide cutting tool and the diamond film.

DETAILED DESCRIPTION OF THE PREFERRED EMBODIMENTS

The fabrication method of a diamond-coated cemented carbide according to the present invention will now be described in more detail.

The method of etching the surface of a cemented carbide cutting tool according to the present invention includes electrolytically etching the same using a NaOH or KOH aqueous solution as an electrolytic solution. Here, the preferable concentrations of the KOH or NaOH solution are 1~60 wt % and 1~70 wt %, respectively, and the cemented carbide cutting tool is attached to the anode. The voltage and the current are controlled in accordance with the concentration of the KOH or NaOH solution.

Another method according to the present invention is to chemically etch the surface of a cemented carbide cutting tool with a $KMnO_4$+KOH aqueous solution. The etching solution is preferably composed of 1~20 wt % $KMnO_4$, 1~60 wt % KOH and balance $H_2O$, and the treatment proceeds for more than one minute as appropriate.

The above mentioned etching methods are facilitated by first washing the cemented carbide cutting tool with distilled water, acetone or trichloroethylene(TCE). When the surface of the cemented carbide cutting tool is etched, the carbide phase of the cemented carbide is irregularly etched and the roughness of the surface of the cemented carbide is increased. Thus, the diamond coating and the surface of the cemented carbide cutting tool having the increased roughness come to have an increased mutual adhesion due to the effect of the mechanical interlocking.

After the etched cemented carbide cutting tool is washed again with distilled water and acetone, the same is etched for 5~30 seconds using a mixed solution of $H_2SO_4$—$H_2O_2$, resulting in the removal of the cobalt binder phase.

Then, after washing the cemented carbide cutting tool with distilled water and acetone and seeding the same in an ultrasonic washer with a diamond powder slurry, it is ultrasonically washed. Then, the cemented carbide cutting tool is coated with a diamond film in accordance with a general known diamond coating process.

Since the etching solution used in the method has a stronger etching effect than the Murakami solution and does not include poisonous potassium ferricyanide, the solution is not harmful to humans and the disposal of the waste of the etching solution is much simpler, and the fabrication cost is reduced because the price of $KMnO_4$ is around 30% that of the pottassium ferrycianide.

The fabrication method of a diamond-coated cemented carbide cutting tool as described above will be understood more clearly with reference to the following examples:

EXAMPLE 1

A pair of K20 SPGN120308 cemented carbide cutting tool is ultrasonically washed with distilled water and acetone. A test piece A was etched for 30 seconds with a solution comprised 20% sulfuric acid and 80% hydrogen peroxide, and after a test piece B was electrolytically etched for 15 minutes under the condition of 8V and 10A, using a 10% KOH aqueous solution as an eletrolytic solution, the test piece B was etched with the same solution used for test piece A.

After the test pieces A and B were washed with acetone again, the test pieces were ultrasonically treated for two minutes in a solution of 0.5 µm of diamond powder dispersed in ethyl alcohol and were then washed with distilled water and acetone again.

A diamond film was deposited under the conditions of 5% methane, 110 torr of pressure and a 960° C. substrate temperature, using a microwave chemical vapor deposition. The thickness of the diamond film deposited was about 50 µm.

After the deposition was finished and the temperature of the test pieces was cooled to an ambient temperature, diamond coating of the test piece A could be peeled off from the substrate, but the coating on test piece B could not be peeled off and remained well bonded.

EXAMPLE 2

The same procedures as as in the example 1 were performed except that a 10 wt % NaOH aqueous solution was used as an electrolytic solution for treating the test piece B instead of the KOH aqueous solution, resulting in the same effect as in example 1.

EXAMPLE 3

Three K20 SPGN120308 cemented carbide cutting tools were ultrasonically washed with distilled water and an acetone. The first test piece A was left untreated, the second test piece B was etched for two hours with a Murakami reagent and the third test piece C was etched for two hours with a solution of 5 g of $KMnO_4$ and 10 g of KOH dissolved in 100 g of distilled water.

After the test pieces A and B were washed in distilled water, they were etched with a solution of 20% sulfuric acid 80% hydrogen peroxide for 30 seconds.

The surface roughnesses of the test pieces A, B and C were measured with a profilometer of which the tip radius of the stylus was 12 µm. The surface roughnesses measured were Ra 0.08 µm, Ra 0.4 µm and Ra 2.0 µm, respectively.

A diamond film having a thickness of about 50 µm was deposited on the test pieces A, B and C under the same conditions as in example 1.

Consequently, the coatings on test pieces A and B peeled off, but the coating on test piece C did not peeled off.

EXAMPLE 4

Two K20 SPGN120308 cemented carbide cutting tools were ultrasonically washed with distilled water and an acetone, and the first test piece A was treated identically to that in example 1. The test piece B was etched for one hour in a solution of 5 g of $KMnO_4$ and 10 g of KOH dissolved in 100 cc of distilled water. After the test pieces A and B were washed with distilled water and acetone, they were ultrasonically treated for two minutes in a solution of 0.5 µm diamond powder particles dispersed in an ethyl alcohol and were then washed with distilled water and acetone again. A diamond film having a thickness of about 50 µm was deposited on the test pieces A and B under the same conditions as in example 1, resulting in achieving the same effect as in example 1.

EXAMPLE 5

Two K20 SPGN120308 cemented carbide cutting tools were ultrasonically washed with distilled water and acetone, and the first test piece A was treated identically to that of example 1, while the second test piece B was etched for one hour in a solution of 5 g of $KMnO_4$ and 10 g of KOH dissolved in 100 cc of the distilled water. After the test pieces A and B were washed with distilled water and acetone, they were ultrasonically treated for two minutes in a solution of 0.5 µm diamond powder particles dispersed in ethyl alcohol and were then washed with distilled water and acetone again. A diamond film having a thickness of about 50 µm was deposited on the test pieces A and B under the same conditions as in example 1.

Using the two test pieces, an experiment was conducted on Al-18% Si alloy used as the object to be cut. The cutting condition was that the cutting speed was 700 m/min, the feed was 0.25 mm/rev and the depth of cut is 1 mm. And the size of the object to be cut was 120 mm in diameter and 120 mm in length, and the object was cut down to have a diameter of 60 mm.

As a result, no peeling off of the diamond film occurred on test piece B, but instead the diamond film was gradually abraded. And after four or five objects were processed, the cemented carbide began to be revealed. But the test piece A was impossible to use for cutting due to the unexpected peeling off of the diamond film occurring while processing the first object to be cut.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed:
1. A fabrication method for a diamond-coated cemented carbide cutting tool, comprising;
   electrolytically etching a cemented carbide cutting tool with an etchant selected from the group consisting of a NaOH aqueous solution and a KOH aqueous solution;

etching a cobalt binder phase of the electrolytically etched cemented carbide cutting tool with a mixed solution of sulfuric acid and hydrogen peroxide;

seeding the etched cemented carbide cutting tool with a diamond powder slurry; and depositing a diamond film on the seeded cemented carbide cutting tool.

2. The fabrication method of claim 1, wherein the concentration of the NaOH aqueous solution is 1~70 wt %.

3. The fabrication method of claim 1, wherein the concentration of the KOH aqueous solution is 1~60 wt %.

4. A fabrication method for a diamond-coated cemented carbide cutting tool, comprising;

chemically etching a cemented carbide cutting tool with a $KMnO_4$+KOH aqueous solution;

etching a cobalt binder phase of the chemically etched cemented carbide cutting tool with a mixed solution of sulfuric acid and hydrogen peroxide;

seeding the etched cemented carbide cutting tool with a diamond powder slurry; and depositing a diamond film on the seeded cemented carbide cutting tool.

5. The fabrication method of claim 4, wherein said $KMnO_4$+KOH aqueous solution is composed of 1~20 wt % $KMnO_4$, 1~60 wt % KOH and balance $H_2O$.

* * * * *